United States Patent
Sakurai et al.

(10) Patent No.: US 8,891,227 B2
(45) Date of Patent: Nov. 18, 2014

(54) PROCESS OF FORMING DIELECTRIC THIN FILM AND THIN FILM CAPACITOR HAVING SAID DIELECTRIC THIN FILM

(75) Inventors: Hideaki Sakurai, Naka-gun (JP); Toshiaki Watanabe, Sanda (JP); Nobuyuki Soyama, Kobe (JP)

(73) Assignee: Mitsubishi Materials Corporation, Tokyo (JP)

( * ) Notice: Subject to any disclaimer, the term of this patent is extended or adjusted under 35 U.S.C. 154(b) by 135 days.

(21) Appl. No.: 13/393,908

(22) PCT Filed: Sep. 2, 2010

(86) PCT No.: PCT/JP2010/065059
§ 371 (c)(1),
(2), (4) Date: May 1, 2012

(87) PCT Pub. No.: WO2011/027833
PCT Pub. Date: Mar. 10, 2011

(65) Prior Publication Data
US 2012/0224297 A1    Sep. 6, 2012

(30) Foreign Application Priority Data

Sep. 2, 2009  (JP) ................. 2009-202474

(51) Int. Cl.
| | |
|---|---|
| *H01G 4/06* | (2006.01) |
| *C01G 23/00* | (2006.01) |
| *C04B 35/624* | (2006.01) |
| *C04B 35/47* | (2006.01) |
| *H01G 4/12* | (2006.01) |
| *H01L 21/02* | (2006.01) |
| *C04B 35/468* | (2006.01) |
| *H01G 7/06* | (2006.01) |
| *H01G 4/33* | (2006.01) |
| *H01L 49/02* | (2006.01) |

(52) U.S. Cl.
CPC ............ *C04B 35/624* (2013.01); *C01G 23/006* (2013.01); *C04B 35/47* (2013.01); *H01G 4/1227* (2013.01); *H01L 21/02197* (2013.01); *C04B 35/4686* (2013.01); *H01G 7/06* (2013.01); *H01G 4/33* (2013.01); *C04B 2235/441* (2013.01); *C04B 2235/6562* (2013.01); *H01L 21/02282* (2013.01); *H01L 28/55* (2013.01)

USPC .......... 361/321.5; 29/25.42; 361/311

(58) Field of Classification Search
USPC ............ 29/25.42; 361/311, 321.1–321.5
See application file for complete search history.

(56) References Cited

U.S. PATENT DOCUMENTS 5,005,102 A * 4/1991 Larson .......................... 361/313
5,645,634 A * 7/1997 Ogi et al. ................ 106/287.19

(Continued)

FOREIGN PATENT DOCUMENTS

| CN | 1194445 A | 9/1998 |
|---|---|---|
| EP | 1887843 A1 | 2/2008 |

(Continued)

OTHER PUBLICATIONS

Lahiry et al, Dielectric Properties of Sol-Gel Derived Barium-Strontium-Titanate (Ba0.4Sr0.6TiO3) Thin Films, Jul. 2000, IEEE Transactions of Ultrasonics, Ferroelectrics, and Frequency Control, vol. 47, No. 4, pp. 854-860.*

(Continued)

*Primary Examiner* — Eric Thomas
(74) *Attorney, Agent, or Firm* — Edwards Wildman Palmer LLP; James E. Armstrong, IV; Nicholas J. DiCeglie, Jr.

(57) ABSTRACT

In this process of forming a dielectric thin film, when a dielectric thin film represented by $Ba_{1-x}Sr_xTi_yO_3$ ($0.2<x<0.6$ and $0.9<y<1.1$) is formed by a sol-gel method, the process from coating to baking is carried out 2 to 9 times, the thickness of the thin film formed after the initial baking is 20 nm to 80 nm, the thickness of each thin film formed after the second baking and beyond is 20 nm to less than 200 nm, each baking from the first time to the second to ninth times is carried out by heating to a prescribed temperature within the range of 500° C. to 800° C. at a heating rate of 1° C. to 50° C./minute in an atmosphere at atmospheric pressure, and the total thickness of the dielectric thin film is 100 nm to 600 nm.

4 Claims, 3 Drawing Sheets

(56) References Cited

U.S. PATENT DOCUMENTS 6,454,964 B1 * 9/2002 Scott et al. ............... 252/182.12
6,803,134 B1 10/2004 Cole et al.

FOREIGN PATENT DOCUMENTS

| JP | 60-236404 A | 11/1985 |
|---|---|---|
| JP | 01-308801 A | 12/1989 |
| JP | 08-007649 A | 1/1996 |
| JP | 09-012354 A | 1/1997 |
| JP | 09-052713 A | 2/1997 |
| JP | 09-078249 A | 3/1997 |
| JP | 11-260667 A | 9/1999 |
| JP | 2000-351623 A | 12/2000 |
| JP | 2007-019432 A | 1/2007 |
| JP | 2008-053563 A | 3/2008 |
| WO | WO-2005/089051 A2 | 9/2005 |

OTHER PUBLICATIONS

Danielle M.Tahan et al, "Preparation and Characterization of $Ba_xSr_{1-x}TiO_3$ Thin Films by a Sol-Gel Technique," Journal of the American Ceramic Society, vol. 79, No. 6, Jun. 1, 1996, pp. 1593-1598, XP055052049, ISSN:0002-7820.

Jian-Gong Cheng et al, "Fabrication and Characterization of Pyroelectric $Ba_{0.8}Sr_{0.2}TiO_3$ Thin Films by a Sol-Gel Process," Journal of The American Ceramic Society, vol. 84, No. 7, Jul. 1, 2001, pp. 1421-1424, XP055052051, ISSN:0002-7820.

Fu Xinghua et al, "Progress of (Sr, Ba) $TiO_3$ ferroelectric thin film and tunability," Bulletin of Materials Science, vol. 27, No. 5, Oct. 1, 2004, pp. 433-439, XP055052164, ISSN:0250-4707.

Sharmistha Lahiry et al, "Dielectric properties of sol-gel derived barium strontium titanate thin films," Thin Solid Films, Elsevier-Sequoia S.A.Lausanne, CH, vol. 516, No. 8, Feb. 1, 2008, pp. 1656-1662, XP022449697, ISSN:0040-6090.

Search Report dated Feb. 19, 2013, issued for the European patent application No. 10813781.1.

First Office Action issued in corresponding Chinese Patent Application No. CN201080038913.2, dated Aug. 2, 2013.

"Sol-gel Fabrication and Character Investigation on BaxSr1-xTiO3 Thin Films", Zhu Weidong, Chinese Master's Thesis Full Text Database, Engineering Science and Technology, vol. 2, No. 1, C028-21, pp. 13-15, 18 and 33-38, Jun. 15, 2002.

Dielectric property of sol-gel derived BaxSr1-xTiO3 (BST) film, Xu Yan, Chinese Master's Thesis Full Text Database, Engineering Science and technology, vol. 1, No. 2, B020-124, pp. 18-20, Dec. 15, 2002.

Notice of Reasons for Rejection issued in corresponding Japanese Patent Application No. JP 2010-192655, dated Apr. 1, 2014.

International Search Report dated Oct. 5, 2010, issued for PCT/JP2010/065059.

* cited by examiner

US 8,891,227 B2

PROCESS OF FORMING DIELECTRIC THIN FILM AND THIN FILM CAPACITOR HAVING SAID DIELECTRIC THIN FILM

TECHNICAL FIELD

The present invention relates to a process of forming a dielectric thin film capable of demonstrating high tunability in the case of using in a thin film capacitor. In addition, the present invention relates to a thin film capacitor having high tunability that has a dielectric thin film formed by this process. Moreover, the present invention relates to a tunable device provided with this thin film capacitor. In the present description, "tunable" refers being able to change capacitance in response to a change in an applied voltage, while "tunability" refers to the variability or changing rate of capacitance.

The present application claims priority on the basis of Japanese Patent Application No. 2009-202474 filed in Japan on Sep. 2, 2009, the contents of which are incorporated herein by reference.

BACKGROUND ART

High-frequency tunable devices such as high-frequency filters, high-frequency antennas or phase shifters incorporate a thin film capacitor, composed of an upper electrode, a lower electrode and a dielectric layer formed between the two electrodes, as a variable capacitance element (tunable element). Thin film capacitors function as capacitors that change the capacitance thereof according to a change in voltage applied between the electrodes. Dielectric thin films formed using a perovskite oxide such as strontium titanate ($SrTiO_3$), barium strontium titanate (BST) or barium titanate ($BaTiO_3$) are used for the dielectric layer that composes these thin film capacitors. In addition to physical vapor deposition methods such as vacuum deposition, sputtering or laser ablation, or chemical vapor deposition method (CVD), or chemical solution methods such as sol-gel methods are also used to form dielectric thin films (see, for example, Patent Document 1).

An example of one of the properties used to evaluate thin film capacitors used in such tunable devices is variability of capacitance versus applied voltage (tunability), and a thin film capacitor that is able to control capacitance over a wide range when a voltage is applied, namely a thin film capacitor having high tunability, is preferred. The reason for this is that the higher the tunability, the greater the ability of a thin film capacitor to accommodate a broader resonance frequency band in response to smaller changes in voltage. More specifically, when the capacitance prior to application of voltage is defined as $C_{0V}$ and the capacitance after a voltage tV has been applied is defined as $C_{tV}$, then tunability is represented by $(C_{0V}-C_{tV})/C_{tV}\times100(\%)$. For example, as shown in FIG. 5, although capacitance changes from $C_{0V}$ in the absence of an applied voltage to $C_{5V}$ when a voltage of 5 V is applied, tunability becomes higher the larger the range from $C_{0V}$ to $C_{5V}$ at this time, and such a thin film capacitor can be said to be a high tunability thin film capacitor. A tunable capacitor has been disclosed as an example of a technology for enhancing tunability in which high tunability is able to be ensured by using a material having a high dielectric constant while maintaining desired impedance during use in a high-frequency band (see, for example, Patent Document 2). The tunable capacitor disclosed in Patent Document 2 ensures high tunability at low capacitance by forming a second dielectric layer having a lower dielectric constant than a first dielectric layer between the first dielectric layer and a top electrode so as to cover a portion of the principal surface of the first dielectric layer.

PRIOR ART DOCUMENTS

Patent Documents

Patent Document 1: Japanese Unexamined Patent Application, First Publication No. S60-236404 (line 10 of upper right column to line 3 of lower left column on page 6)

Patent Document 2: Japanese Unexamined Patent Application, First Publication No. 2008-53563 (paragraphs [0004] and [0008])

DISCLOSURE OF INVENTION

Problems to be Solved by the Invention

However, even though the tunability of numerous thin film capacitors currently available on the market may be comparatively high, since their tunability is still only about 40% to 50%, and is not considered to be adequately high, various research is being conducted from various perspectives for the purpose of improving tunable properties.

On the other hand, as a result of conducting extensive studies, the inventors of the present invention determined that the microstructure observed in a film cross-section of a dielectric thin film is intimately related to the tunable properties of thin film capacitors. For example, in the case of a dielectric thin film 26 having a microstructure in which granular crystals having a large grain diameter are aggregated in a longitudinal cross-section of the film as shown in FIG. 3, or a dielectric thin film 36 having a microstructure in which fine granular crystals are aggregated as shown in FIG. 4, it tends to be difficult to obtain high tunability. On the other hand, in the case of a dielectric thin film 16 having a microstructure in which a plurality of columnar crystals are arranged longitudinally in the direction of film thickness in a longitudinal cross-section of the film as shown in FIG. 2, tunability is improved in comparison with the dielectric thin films shown in FIGS. 3 and 4, the fact of which was focused on by the inventors of the present invention, thereby leading to the completion thereof.

An object of the present invention is to provide a process of forming a dielectric thin film capable of demonstrating high tunability in the case of being used in a thin film capacitor and the like, and that dielectric thin film.

Another object of the present invention is to provide a thin film capacitor having high tunability and a tunable device provided with that thin film capacitor.

Means for Solving the Problems

A first aspect of the present invention is a process of forming a dielectric thin film having a composition consisting of $Ba_{1-x}Sr_xTi_yO_3$ by coating and drying onto a support a composition for forming a $Ba_{1-x}Sr_xTi_yO_3$ thin film, obtained by dissolving an organic barium compound, an organic strontium compound and a titanium alkoxide in an organic solvent at a molar ratio of Ba:Sr:Ti of 1-x:x:y, to form a coated film, followed by baking the support on which the coated film has been formed, wherein the process from coating to baking is carried out two to nine times, the thickness of the thin film formed after initial baking is 20 nm to 80 nm, the thickness of each thin film formed after the second baking and beyond is 20 nm to less than 200 nm, each baking from the first time to the second to ninth times is carried out by heating to a prescribed temperature within a range of 500° C. to 800° C. at a heating rate of 1° C. to 50° C./minute in an atmosphere at atmospheric pressure, the total thickness of the dielectric thin film is 100 nm to 600 nm, and the values of x and y indicating the composition of the dielectric thin film are such that 0.2<x<0.6 and 0.9<y<1.1.

A second aspect of the present invention is a thin film capacitor having a substrate, an insulator film formed on the substrate, an adhesion layer formed on the insulator film, a lower electrode formed on the adhesion layer, a dielectric thin film formed according to the formation process of the first aspect on the lower electrode, and an upper electrode formed on the dielectric thin film, wherein the changing rate T of capacitance according to an applied voltage as indicated with the following formula (1) is 60% or more.

$$T=(C_{0V}-C_{5V})/C_{0V} \times 100 \quad (1)$$

In formula (1), $C_{0V}$ represents capacitance in the absence of an applied voltage, while $C_{5V}$ represents capacitance during an applied voltage of 5 V.

A third aspect of the present invention is a dielectric thin film formed according to the formation process of the first aspect that has a microstructure in which a plurality of columnar crystals are longitudinally arranged in the direction of thickness in a longitudinal cross-section thereof.

A fourth aspect of the present invention is a tunable device provided with the thin film capacitor of the second aspect.

Effects of the Invention

In the formation process of the first aspect of the present invention, the process from coating to baking is carried out two to nine times, the thickness of the thin film formed after the initial baking is 20 nm to 80 nm, and the thickness of each thin film formed after the second baking and beyond is 20 nm to less than 200 nm. In addition, each baking from the first time to the second to ninth times is carried out by heating to a prescribed temperature within the range of 500° C. to 800° C. at a heating rate of 1° C. to 50° C./minute in an atmosphere at atmospheric pressure. The total thickness of the finally formed dielectric thin film is 100 nm to 600 nm, and the composition thereof is represented by $Ba_{1-x}Sr_xTi_yO_3$ (0.2<x<0.6 and 0.9<y<1.1). As a result of forming a dielectric thin film in this manner, a dielectric thin film can be formed that has a microstructure in which a plurality of columnar crystals are longitudinally arranged in the direction of thickness in a longitudinal cross-section of the film. As a result, a thin film capacitor and the like that is formed by using this dielectric thin film is able to demonstrate extremely high tunability.

The thin film capacitor of the second aspect of the present invention allows the obtaining of extremely high tunability having a changing rate of capacitance in response to an applied voltage of 60% or more as a result of being provided with a dielectric thin film obtained according to the formation process of the present invention.

The dielectric thin film of the third aspect of the present invention enables the demonstration of extremely high tunability in a thin film capacitor and the like formed by using that dielectric thin film that has a microstructure in which a plurality of columnar crystals are arranged longitudinally in the direction of thickness in a longitudinal cross-section of the film as a result of being formed according to the formation process of the present invention.

The tunable device of the fourth aspect of the present invention allows the obtaining of extremely high tunable properties as a result of being provided with a tunable device in the form of the thin film capacitor of the present invention.

BEST MODE FOR CARRYING OUT THE INVENTION

The following provides an explanation of embodiments of the present invention based on the drawings.

Figure 2:
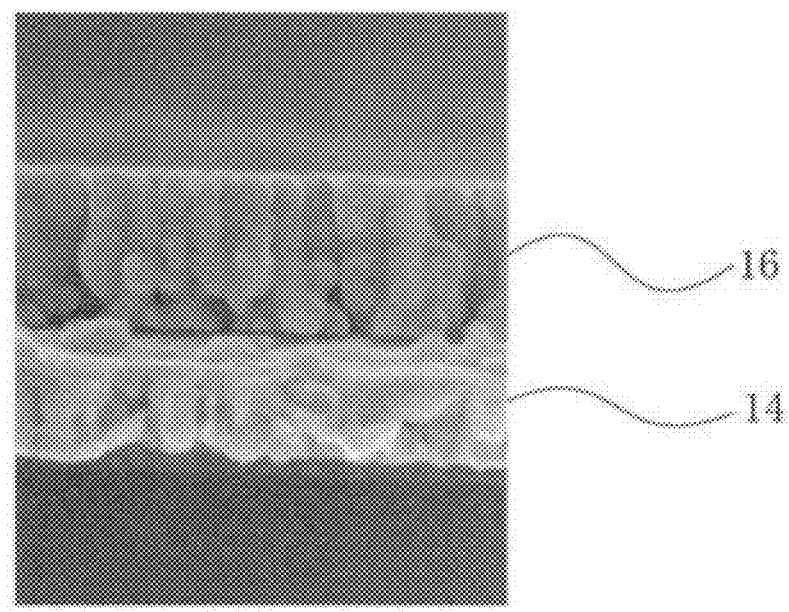
FIG. 2 is an enlarged cross-sectional micrograph of a dielectric thin film formed according to a formation process of an embodiment of the present invention.
Figure 3:
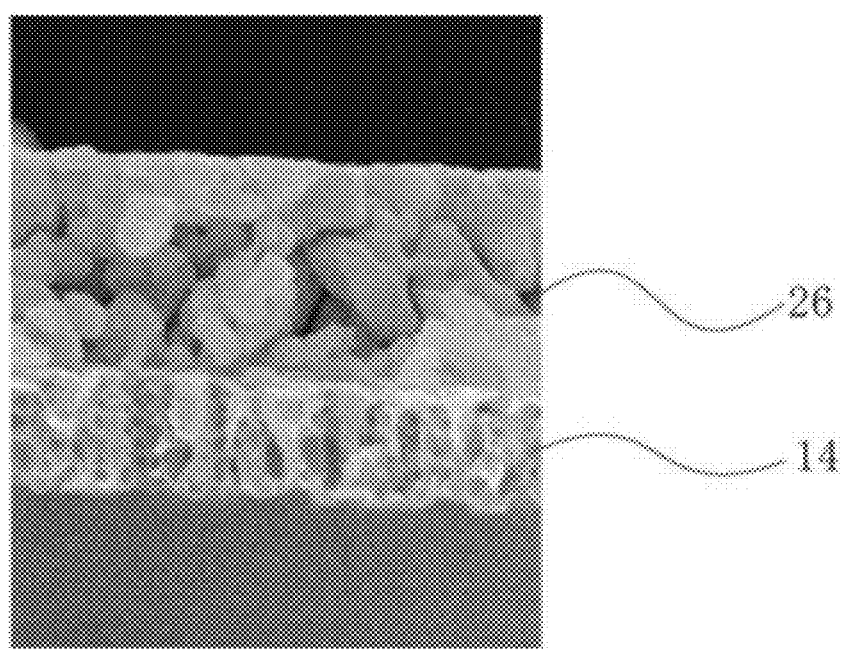
FIG. 3 is an enlarged cross-sectional micrograph showing an example of a dielectric thin film formed according to a formation process of the prior art.
Figure 4:
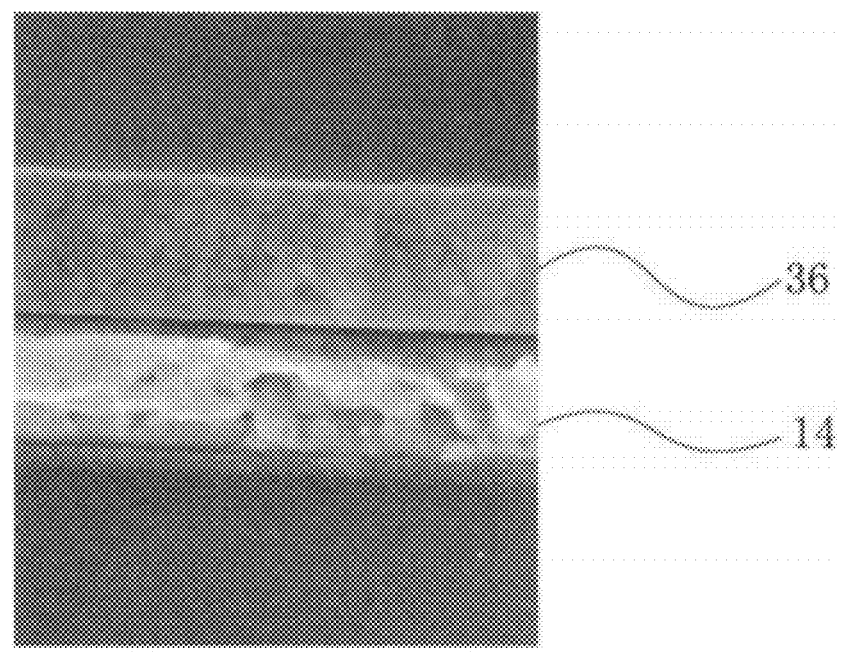
FIG. 4 is an enlarged cross-sectional micrograph showing another example of a dielectric thin film formed according to a formation process of the prior art.

The present invention demonstrates high tunability by forming a dielectric thin film used as a dielectric layer to have a desired microstructure in a thin film capacitor and the like. As previously described, the desired microstructure refers to a microstructure in which a plurality of columnar crystals are longitudinally arranged in the direction of thickness in a longitudinal cross-section of the dielectric thin film 16 formed on a lower electrode 14 shown in FIG. 2. The dielectric thin film 16 having this microstructure is able to demonstrate high tunability in a thin film capacitor and the like formed by using this dielectric thin film 16 in comparison with the dielectric thin film 26 having a microstructure in which granular crystals having a large grain diameter are aggregated as shown in FIG. 3 or the dielectric thin film 36 having a microstructure in which fine granular crystals are aggregated as shown in FIG. 4. The reason for this is presumed to be attributable to the increase in relative permittivity as the structure becomes larger.

The microstructure of the present invention refers to a microstructure formed from, for example, a plurality of columnar crystals in each crystal grain is roughly mutually parallel in the lengthwise direction and perpendicular to the surface of the dielectric thin film.

The dielectric thin film 16 having this microstructure can be formed by a so-called sol-gel method in which a composition for forming a thin film is coated and dried on a support to form a coated film followed by baking the support on which the coated film is formed. A detailed explanation of this formation process is explained below by using the example of a production process of a thin film capacitor.

Figure 1:
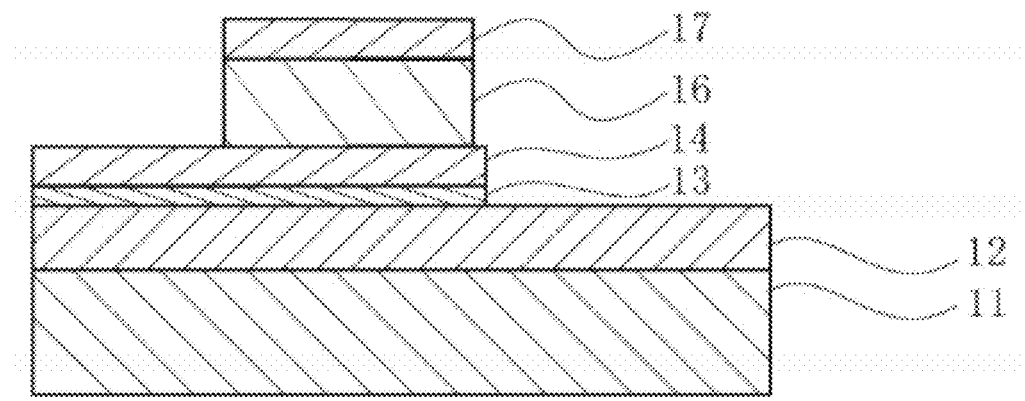
FIG. 1 is a cross-section block diagram of a thin film capacitor of an embodiment of the present invention.

As shown in FIG. 1, thin film capacitors consist of a three-layer type obtained by laminating the lower electrode 14, the dielectric thin film 16 and an upper electrode 17 on a substrate 11 in that order as shown in FIG. 1, and a two-layer type not shown obtained by using an Si substrate having low specific resistance as a lower electrode and laminating a dielectric thin film and upper electrode thereon. The following provides an explanation of a thin film capacitor using the case of the former as an example.

Examples of the substrate 11 include an Si substrate, and on an insulator film 12, a thermal oxide film ($SiO_2$) formed on the surface of this Si substrate by dry oxidation or wet oxidation in an oxidizing gas atmosphere. In addition, a precious metal such as platinum (Pt), for example, is used for the lower electrode 14, and this lower electrode 14 can be formed by a vapor phase growth method such as sputtering or vacuum deposition or by a screen printing method. Moreover, an adhesion layer 13 may be suitably provided to ensure adhesion between the insulator film 12 and the lower electrode 14. A metal thin film having high oxidation affinity, such as that of Ti or Ta, or an oxide thereof, can be used for the adhesion layer 13. In this example of a thin film capacitor, an example of the support on which the dielectric thin film 16 is formed is the substrate 11 having the insulator film 12 on which the adhesion layer 13 and lower electrode 14 are laminated, specific examples of which include Pt/Ti/SiO$_2$/Si, Pt/IrO/Ir/SiO$_2$/Si, Pt/TiN/SiO$_2$/Si, Pt/Ta/SiO$_2$/Si and Pt/Ir/SiO$_2$/Si.

In addition, an example of the composition for forming a thin film is a Ba$_{1-x}$Sr$_x$Ti$_y$O$_3$ composition for forming a thin film obtained by dissolving an organic barium compound, an organic strontium compound and a titanium alkoxide in an organic solvent so that the molar ratio of Ba:Sr:Ti is 1-x:x:y. Since the molar ratio in the composition is reflected in the molar ratio of the dielectric thin film following the formation thereof, the values of x and y are within the ranges of 0.2<x<0.6 and 0.9<y<1.1 for reasons to be subsequently described. A carboxylate that is a metal salt of a carboxylic acid represented by the general formula C$_n$H$_{2n+1}$COOH (where, 3≤n≤7) and is able to adopt the structure shown in the following formula (2) is preferably used for the organic barium compound and the organic strontium compound. In formula (2), R$_1$ to R$_6$ represent hydrogen atoms, methyl groups or ethyl groups, and M represents Ba or Sr.

[Chemical Formula 1]

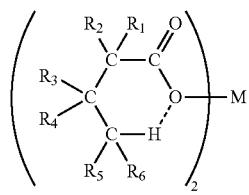

(2)

More specifically, the organic barium compound is particularly preferably barium 2-ethylhexanoate or barium 2-ethylbutyrate in consideration of availability of the raw materials. In addition, the organic strontium compound is particularly preferably strontium 2-ethylhexanoate or strontium 2-ethylbutyrate also in consideration of raw material availability. On the other hand, the titanium alkoxide is particularly preferably titanium isopropoxide or titanium butoxide again in consideration of raw material availability.

This composition for forming a thin film is coated onto a support, namely the lower substrate 14 in this example. Continuing, the coated composition is dried to form a coated film followed by baking the support on which the coated film is formed to form the dielectric thin film 16 of a desired thickness on the lower electrode 14.

When forming the dielectric thin film 16 of a desired thickness on the lower electrode 14, the process from coating to baking is carried out two or more times in the present invention. The thickness of the thin film formed after the initial baking is 20 nm to 80 nm, while the thickness of each thin film formed after the second baking and beyond is 20 nm to less than 200 nm. The reason for carrying out the process from coating to baking two or more times is that if a thin film is formed to a desired film thickness in a single process, cracks form in the surface of the dielectric thin film due to differences in stress with the substrate and the like during baking, and for reasons to be subsequently described, the aforementioned desired microstructure consisting of columnar crystals is unable to be obtained. The reason for making the thickness of the thin film formed after the initial baking 80 nm or less is that, if a thick film is attempted be formed once on a lower electrode having different physical properties than those of the thin film, nuclei serving as starting points of crystal growth are formed not only at the electrode interface but also within the film during baking, and these nuclei facilitate the growth of granular crystals at the starting points, thereby preventing the obtaining of the desired columnar crystals. On the other hand, if the thin film is formed to a thickness of 80 nm or less, nuclei serving as starting points of crystal growth are not formed within the film and are preferentially formed in the vicinity of the interface with the lower electrode, thereby making it possible to form a microstructure consisting of columnar crystals. The desired microstructure consisting of columnar crystals can ultimately be obtained by using the initial thin film formed at the interface with the lower electrode in this manner as a seed layer, and successively growing columnar crystals by the process from coating to baking that is carried out repeatedly thereafter. In addition, the reason for making the thickness of the thin film formed after the initial baking 20 nm or more is that, if the thickness if less than 20 nm, hemispherical bulges of about 1 μm or less referred to as hillocks occur on the lower electrode during baking, and these hillocks cause problems in terms of leakage current and withstand voltage properties. In particular, the thickness of the thin film formed after initial baking is preferably 25 nm to 60 nm.

In this manner, if the initial thin film is formed as a seed layer, the thin film can be grown into the desired microstructure consisting of columnar crystals even if the thickness of each thin film formed after the second baking and beyond is somewhat thick. The reason for limiting the thickness of each thin film formed after the second baking and beyond to the aforementioned range is that, if the thickness of each thin film is less then the lower limit value thereof, the number of processes from coating to baking becomes excessively large, thereby resulting in poor productivity. In addition, as the number of times baking is carried out increases, more of the hillocks described above are formed on the lower electrode, thereby creating problems in terms of leakage current and withstand voltage properties. On the other hand, if the upper limit value is exceeded, nuclei end up forming within the film as well, thereby preventing the obtaining of a microstructure consisting of columnar crystals even if a seed layer is formed. In particular, the thickness of each thin film formed after the second baking and beyond is preferably 30 nm to 150 nm. In addition, among these ranges, the thickness of each thin film formed after the second baking and beyond is preferably equal to or greater than the film thickness of the thin film formed after the initial baking. In addition, form the reasons previously described, the process from coating to baking is repeated two to nine times and preferably repeated 3 to 6 times.

Although a conventional coating method such as spin coating, dip coating or spray coating can be preferably used to coat the composition for forming a thin film, since it is necessary to precisely adjust each film thickness of the thin films formed after baking a plurality of times in the present invention, spin coating is used particularly preferably. Adjustment of film thickness is carried out by adjusting the rotating speed of spin coating and the viscosity of the composition for forming a thin film.

Drying of the composition for forming a thin film that has been coated on the lower electrode 14 or a thin film formed after baking is preferably carried out within the range of room temperature to 350° C. in an atmosphere at atmospheric pressure. In addition, thin film thickness is adjusted so that the thickness of each thin film after baking is within each of the aforementioned ranges. Each baking process from the initial baking to the second to ninth baking of the thin films formed by drying the coated composition for forming a thin film is carried out by heating to a prescribed temperature within the range of 500° C. to 800° C. at a heating rate of 1° C. to 50° C./minute in an atmosphere at atmospheric pressure and preferably holding for 1 minute to 120 minutes. The reason for limiting the heating rate to the aforementioned range is that if the heating rate is below the lower limit value, the process ends up becoming extremely long, while on the other hand, if the heating rate exceeds the upper limit value, a microstructure composed of columnar crystals is unable to be obtained even if each film thickness after baking is set to the aforementioned ranges. In addition, the reason for limiting the prescribed temperature, namely the baking temperature, to the aforementioned range is that if the prescribed temperature is below the lower limit value, adequate crystallinity is unable to be obtained thereby preventing the obtaining of high tunability, while if the prescribed temperature exceeds the upper limit value, there is the risk of causing degeneration of the electrodes. Each drying and baking from the initial time to the final time may vary within the range of the aforementioned conditions even if the respective conditions are the same.

Baking can be carried out at atmospheric pressure equivalent to an atmosphere at atmospheric pressure, and may be carried out, for example, in a nitrogen atmosphere at atmospheric pressure.

The total thickness of the dielectric thin film formed by going through the processes described above is 100 nm to 600 nm. The reason for limiting the total thickness to the range of 100 nm to 600 nm is that if the total thickness is below the lower limit value, problems occur with respect to leakage current and withstand voltage properties. The total thickness of the dielectric thin film is preferably within the range of 250 nm to 450 nm. In addition, the values of x and y in the composition of the dielectric thin film, namely the dielectric thin film represented by $Ba_{1-x}Sr_xTi_yO_3$, are such that $0.2<x<0.6$ and $0.9<y<1.1$. If x is outside the aforementioned range, relative permittivity decreases and becomes inadequate. In addition, if the value of y is outside the aforementioned range, tunability decreases. The values of x and y are preferably such that $0.25 \le x \le 0.55$ and $0.95 \le y \le 1.05$.

Following formation of the dielectric thin film 16, the upper electrode 17 is laminated onto the dielectric thin film 16 to obtain a thin film capacitor. Similar to the aforementioned lower electrode 14, a precious metal such as Pt is also used for the upper electrode 17, and the upper electrode 17 can be formed by a vapor phase growth method such as sputtering or vacuum deposition or by a screen printing method. Furthermore, the composition of the thin film capacitor is not limited to the composition shown in the example.

Figure 5:
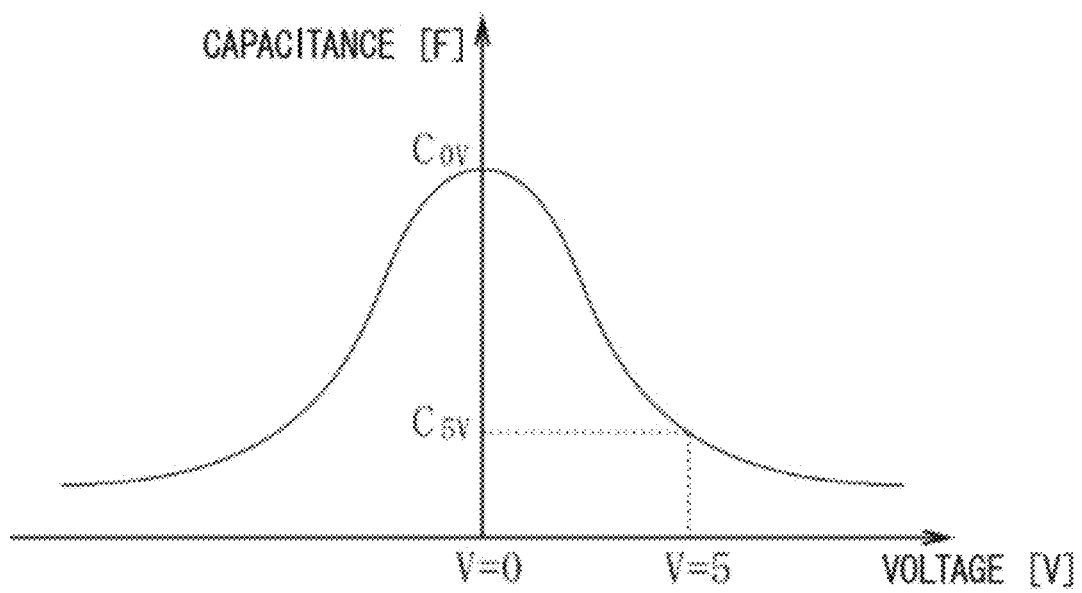
FIG. 5 is an explanatory drawing showing a change in capacitance accompanying a change in applied voltage in a variable capacitance element.

As has been described above, a thin film capacitor having the dielectric thin film of the present invention allows the obtaining of high tunability as a result of the dielectric thin film having a desired microstructure consisting of columnar crystals in a longitudinal cross-section of the film. For example, in FIG. 5, the range of a capacitance $C_{0V}$ in the absence of an applied voltage to a capacitance $C_{5V}$ during application of an applied voltage of 5 V, namely the variable range, can be made to be larger than that of the prior art. More specifically, the value of T is indicated to be 60% or more in the following formula (1).

$$T=(C_{0V}-C_{5V})/C_{0V} \times 100 \quad (1)$$

In this manner, a thin film capacitor formed by using the dielectric thin film of the present invention has various superior properties, including tunability, and can be applied to high-frequency tunable devices such as high-frequency filters, high-frequency antennas or phase shifters.

EXAMPLES

The following provides a detailed explanation of examples of the present invention along with comparative examples thereof.

Example 1

First, as shown in FIG. 1, a substrate 11 was prepared in which the adhesion layer 13 and the Pt lower electrode 14 were laminated on the insulator film 12. In addition, barium 2-ethylhexanoate as organic barium compound, strontium 2-ethylhexanoate as organic strontium compound, and titanium isopropoxide as titanium alkoxide were prepared, and these were dissolved in isoamyl acetate so that the molar ratio of Ba, Sr and Ti was 45:55:100 to prepare a composition for forming a thin film.

Next, after coating this composition for forming a thin film onto the Pt lower electrode 14 laminated on the substrate 11 by spin coating and forming a coated film by drying in air at 200° C., the coated film was heated to 700° C. at a heating rate of 5° C./min in air followed by holding at this temperature (baking temperature) for 60 minutes to form a thin film having a thickness of 80 nm Next, the process from coating to baking was carried out a total of four times, including the initial coating and baking, under the same conditions as described above to form the dielectric thin film 16 on the Pt lower electrode 14 such that the molar ratio of Ba, Sr and Ti of the dielectric thin film 16 was 45:55:100 and the total thickness thereof was 320 nm. Furthermore, the thickness of each thin film formed after the second baking and beyond was 80 nm in all cases.

Next, the Pt upper electrode 17 measuring about 250 μm×250 μm square was formed on the formed dielectric thin film 16 by sputtering method using a metal mask to obtain a thin film capacitor. This thin film capacitor was designated as Example 1.

Example 2

A thin film capacitor was obtained in the same manner as Example 1 with the exception of making the molar ratio of Ba, Sr and Ti in the composition for forming a thin film, namely the molar ratio of Ba, Sr and Ti in the dielectric thin film after forming, to be 50:50:100. This thin film capacitor was designated as Example 2.

Example 3

A thin film capacitor was obtained in the same manner as Example 1 with the exception of making the molar ratio of Ba, Sr and Ti in the composition for forming a thin film, namely the molar ratio of Ba, Sr and Ti in the dielectric thin film after forming, to be 70:30:100. This thin film capacitor was designated as Example 3.

Example 4

A thin film capacitor was obtained in the same manner as Example 1 with the exception of making the molar ratio of Ba, Sr and Ti in the composition for forming a thin film, namely the molar ratio of Ba, Sr and Ti in the dielectric thin film after forming, to be 75:25:100. This thin film capacitor was designated as Example 4.

Example 5

A thin film capacitor was obtained in the same manner as Example 1 with the exception of making the molar ratio of Ba, Sr and Ti in the composition for forming a thin film, namely the molar ratio of Ba, Sr and Ti in the dielectric thin film after forming, to be 70:30:95. This thin film capacitor was designated as Example 5.

Example 6

A thin film capacitor was obtained in the same manner as Example 1 with the exception of making the molar ratio of Ba, Sr and Ti in the composition for forming a thin film, namely the molar ratio of Ba, Sr and Ti in the dielectric thin film after forming, to be 70:30:105. This thin film capacitor was designated as Example 6.

Example 7

A thin film capacitor was obtained in the same manner as Example 3 with the exception of making the thickness of the thin film formed after the initial baking to be 40 nm, making the thickness of each thin film formed after the second baking and beyond to be 40 nm, and carrying out the process from coating to baking a total of 8 times, including the initial coating and baking. This thin film capacitor was designated as Example 7.

Example 8

A thin film capacitor was obtained in the same manner as Example 3 with the exception of making the thickness of the thin film formed after the initial baking to be 80 nm, making the thickness of each thin film formed after the second baking and beyond to be 120 nm, and carrying out the process from coating to baking a total of 3 times, including the initial coating and baking. This thin film capacitor was designated as Example 8.

Example 9

A thin film capacitor was obtained in the same manner as Example 3 with the exception of making the thickness of the thin film formed after the initial baking to be 80 nm, making the thickness of each thin film formed after the second baking and beyond to be 80 nm, carrying out the process from coating to baking a total of 2 times, including the initial coating and baking, and forming a dielectric thin film having a total thickness of 160 nm. This thin film capacitor was designated as Example 9.

Example 10

A thin film capacitor was obtained in the same manner as Example 3 with the exception of making the heating rate during baking to be 30° C./minute. This thin film capacitor was designated as Example 10.

Example 11

A thin film capacitor was obtained in the same manner as Example 3 with the exception of making the baking temperature to be 500° C. This thin film capacitor was designated as Example 11.

Example 12

A thin film capacitor was obtained in the same manner as Example 3 with the exception of making the baking temperature to be 600° C. This thin film capacitor was designated as Example 12.

Example 13

A thin film capacitor was obtained in the same manner as Example 3 with the exception of making the baking temperature to be 800° C. This thin film capacitor was designated as Example 13.

Example 14

A thin film capacitor was obtained in the same manner as Example 1 with the exception of preparing the composition for forming a thin film using barium 2-ethylbutyrate for the organic barium compound and using strontium 2-ethylbutyrate for the organic strontium compound. This thin film capacitor was designated as Example 14.

Example 15

A thin film capacitor was obtained in the same manner as Example 1 with the exception of carrying out baking in a nitrogen gas atmosphere at atmospheric pressure. This thin film capacitor was designated as Example 15.

Example 16

A thin film capacitor was obtained in the same manner as Example 2 with the exception of carrying out baking in a nitrogen gas atmosphere at atmospheric pressure. This thin film capacitor was designated as Example 16.

Example 17

A thin film capacitor was obtained in the same manner as Example 3 with the exception of carrying out baking in a nitrogen gas atmosphere at atmospheric pressure. This thin film capacitor was designated as Example 17.

Example 18

A thin film capacitor was obtained in the same manner as Example 4 with the exception of carrying out baking in a nitrogen gas atmosphere at atmospheric pressure. This thin film capacitor was designated as Example 18.

Example 19

A thin film capacitor was obtained in the same manner as Example 5 with the exception of carrying out baking in a nitrogen gas atmosphere at atmospheric pressure. This thin film capacitor was designated as Example 19.

Example 20

A thin film capacitor was obtained in the same manner as Example 6 with the exception of carrying out baking in a nitrogen gas atmosphere at atmospheric pressure. This thin film capacitor was designated as Example 20.

Example 21

A thin film capacitor was obtained in the same manner as Example 7 with the exception of carrying out baking in a nitrogen gas atmosphere at atmospheric pressure. This thin film capacitor was designated as Example 21.

Example 22

A thin film capacitor was obtained in the same manner as Example 8 with the exception of carrying out baking in a nitrogen gas atmosphere at atmospheric pressure. This thin film capacitor was designated as Example 22.

Example 23

A thin film capacitor was obtained in the same manner as Example 9 with the exception of carrying out baking in a nitrogen gas atmosphere at atmospheric pressure. This thin film capacitor was designated as Example 23.

Example 24

A thin film capacitor was obtained in the same manner as Example 10 with the exception of carrying out baking in a nitrogen gas atmosphere at atmospheric pressure. This thin film capacitor was designated as Example 24.

Example 25

A thin film capacitor was obtained in the same manner as Example 11 with the exception of carrying out baking in a nitrogen gas atmosphere at atmospheric pressure. This thin film capacitor was designated as Example 25.

Example 26

A thin film capacitor was obtained in the same manner as Example 12 with the exception of carrying out baking in a nitrogen gas atmosphere at atmospheric pressure. This thin film capacitor was designated as Example 26.

Example 27

A thin film capacitor was obtained in the same manner as Example 13 with the exception of carrying out baking in a nitrogen gas atmosphere at atmospheric pressure. This thin film capacitor was designated as Example 27.

Example 28

A thin film capacitor was obtained in the same manner as Example 14 with the exception of carrying out baking in a nitrogen gas atmosphere at atmospheric pressure. This thin film capacitor was designated as Example 28.

Comparative Example 1

A thin film capacitor was obtained in the same manner as Example 1 with the exception of making the molar ratio of Ba, Sr and Ti in the composition for forming a thin film, namely the molar ratio of Ba, Sr and Ti in the dielectric thin film after forming, to be 10:90:100. This thin film capacitor was designated as Comparative Example 1.

Comparative Example 2

A thin film capacitor was obtained in the same manner as Example 1 with the exception of making the molar ratio of Ba, Sr and Ti in the composition for forming a thin film, namely the molar ratio of Ba, Sr and Ti in the dielectric thin film after forming, to be 30:70:100. This thin film capacitor was designated as Comparative Example 2.

Comparative Example 3

A thin film capacitor was obtained in the same manner as Example 1 with the exception of making the molar ratio of Ba, Sr and Ti in the composition for forming a thin film, namely the molar ratio of Ba, Sr and Ti in the dielectric thin film after forming, to be 90:10:100. This thin film capacitor was designated as Comparative Example 3.

Comparative Example 4

A thin film capacitor was obtained in the same manner as Example 1 with the exception of making the molar ratio of Ba, Sr and Ti in the composition for forming a thin film, namely the molar ratio of Ba, Sr and Ti in the dielectric thin film after forming, to be 100:0:100. This thin film capacitor was designated as Comparative Example 4.

Comparative Example 5

A thin film capacitor was obtained in the same manner as Example 3 with the exception of making the thickness of the thin film formed after the initial baking to be 10 nm, making the thickness of each thin film formed after the second baking and beyond to be 10 nm, and carrying out the process from coating to baking a total of 32 times, including the initial coating and baking. This thin film capacitor was designated as Comparative Example 5.

Comparative Example 6

A thin film capacitor was obtained in the same manner as Example 3 with the exception of making the thickness of the thin film formed after the initial baking to be 160 nm, making the thickness of each thin film formed after the second baking and beyond to be 160 nm, and carrying out the process from coating to baking a total of 2 times, including the initial coating and baking. This thin film capacitor was designated as Comparative Example 6.

Comparative Example 7

A thin film capacitor was obtained in the same manner as Example 3 with the exception of making the thickness of the thin film formed after the initial baking to be 320 nm, and carrying out the process from coating to baking a total of 1 time. This thin film capacitor was designated as Comparative Example 7.

Comparative Example 8

A thin film capacitor was obtained in the same manner as Example 3 with the exception of carrying out the process from coating to baking a total of 10 times, including the initial coating and baking, and forming a dielectric thin film having a total thickness of 800 nm. This thin film capacitor was designated as Comparative Example 8.

Comparative Example 9

A thin film capacitor was obtained in the same manner as Example 3 with the exception of making the thickness of the thin film formed after the initial baking to be 80 nm, carrying out the process from coating to baking a total of 1 time, and forming a dielectric thin film having a total thickness of 80 nm. This thin film capacitor was designated as Comparative Example 9.

Comparative Example 10

A thin film capacitor was obtained in the same manner as Example 3 with the exception of making the heating rate during baking to be 60° C./minute. This thin film capacitor was designated as Comparative Example 10.

Comparative Example 11

A thin film capacitor was obtained in the same manner as Example 3 with the exception of making the heating rate during baking to be 100° C./minute. This thin film capacitor was designated as Comparative Example 11.

Comparative Example 12

A thin film capacitor was obtained in the same manner as Example 3 with the exception of making the heating rate during baking to be 600° C./minute. This thin film capacitor was designated as Comparative Example 12.

Comparative Example 13

A thin film capacitor was obtained in the same manner as Example 3 with the exception of making the baking temperature to be 450° C. This thin film capacitor was designated as Comparative Example 13.

Comparative Example 14

A thin film capacitor was obtained in the same manner as Example 3 with the exception of making the baking temperature to be 900° C. This thin film capacitor was designated as Comparative Example 14.

Comparative Example 15

A thin film capacitor was obtained in the same manner as Comparative Example 1 with the exception of carrying out baking in a nitrogen gas atmosphere at atmospheric pressure. This thin film capacitor was designated as Comparative Example 15.

Comparative Example 16

A thin film capacitor was obtained in the same manner as Comparative Example 2 with the exception of carrying out baking in a nitrogen gas atmosphere at atmospheric pressure. This thin film capacitor was designated as Comparative Example 16.

Comparative Example 17

A thin film capacitor was obtained in the same manner as Comparative Example 3 with the exception of carrying out baking in a nitrogen gas atmosphere at atmospheric pressure. This thin film capacitor was designated as Comparative Example 17.

Comparative Example 18

A thin film capacitor was obtained in the same manner as Comparative Example 4 with the exception of carrying out baking in a nitrogen gas atmosphere at atmospheric pressure. This thin film capacitor was designated as Comparative Example 18.

Comparative Example 19

A thin film capacitor was obtained in the same manner as Comparative Example 5 with the exception of carrying out baking in a nitrogen gas atmosphere at atmospheric pressure. This thin film capacitor was designated as Comparative Example 19.

Comparative Example 20

A thin film capacitor was obtained in the same manner as Comparative Example 6 with the exception of carrying out baking in a nitrogen gas atmosphere at atmospheric pressure. This thin film capacitor was designated as Comparative Example 20.

Comparative Example 21

A thin film capacitor was obtained in the same manner as Comparative Example 7 with the exception of carrying out baking in a nitrogen gas atmosphere at atmospheric pressure. This thin film capacitor was designated as Comparative Example 21.

Comparative Example 22

A thin film capacitor was obtained in the same manner as Comparative Example 8 with the exception of carrying out baking in a nitrogen gas atmosphere at atmospheric pressure. This thin film capacitor was designated as Comparative Example 22.

Comparative Example 23

A thin film capacitor was obtained in the same manner as Comparative Example 9 with the exception of carrying out baking in a nitrogen gas atmosphere at atmospheric pressure. This thin film capacitor was designated as Comparative Example 23.

Comparative Example 24

A thin film capacitor was obtained in the same manner as Comparative Example 10 with the exception of carrying out baking in a nitrogen gas atmosphere at atmospheric pressure. This thin film capacitor was designated as Comparative Example 24.

Comparative Example 25

A thin film capacitor was obtained in the same manner as Comparative Example 11 with the exception of carrying out baking in a nitrogen gas atmosphere at atmospheric pressure. This thin film capacitor was designated as Comparative Example 25.

Comparative Example 26

A thin film capacitor was obtained in the same manner as Comparative Example 12 with the exception of carrying out baking in a nitrogen gas atmosphere at atmospheric pressure. This thin film capacitor was designated as Comparative Example 26.

Comparative Example 27

A thin film capacitor was obtained in the same manner as Comparative Example 13 with the exception of carrying out baking in a nitrogen gas atmosphere at atmospheric pressure. This thin film capacitor was designated as Comparative Example 27.

Comparative Example 28

A thin film capacitor was obtained in the same manner as Comparative Example 14 with the exception of carrying out baking in a nitrogen gas atmosphere at atmospheric pressure. This thin film capacitor was designated as Comparative Example 28.

<Comparative Testing and Evaluation>

The thin film capacitors obtained in Examples 1 to 28 and Comparative Examples 1 to 28 were evaluated for tunability. The results are shown in the following Tables 1 to 4.

More specifically, a voltage up to 5 V was applied at a frequency of 1 MHz and at a temperature of 23° C. between the Pt lower electrode and the Pt upper electrode of the thin film capacitors, and the changing rate T of capacitance as calculated from the following formula (1) was measured from a capacitance $C_{0V}$ when the voltage was not applied and a capacitance $C_{5V}$ when a voltage of 5 V was applied. Furthermore, the capacitance changing rate T was measured using an impedance material analyzer (Hewlett-Packard, Model HP4291A).

$$T = (C_{0V} - C_{5V}) / C_{0V} \times 100 \tag{1}$$

TABLE 1

| | Dielectric thin film deposition conditions | | | | | | | | | |
|---|---|---|---|---|---|---|---|---|---|---|
| | Composition molar ratio | | | Baking conditions | | | Dielectric thin film thickness (nm) | | | Times process from coating to baking carried out | Evaluation Tunability (%) |
| | | | | Heating rate (° C./ min) | Baking temp. (° C.) | Atmo- sphere | Initial | 2nd time and beyond | Total thickness | | |
| | Ba | Sr | Ti | | | | | | | | |
| Ex. 1 | 45 | 55 | 100 | 5 | 700 | Air | 80 | 80 | 320 | 4 | 60 |
| Ex. 2 | 50 | 50 | 100 | 5 | 700 | Air | 80 | 80 | 320 | 4 | 66 |
| Ex. 3 | 70 | 30 | 100 | 5 | 700 | Air | 80 | 80 | 320 | 4 | 77 |
| Ex. 4 | 75 | 25 | 100 | 5 | 700 | Air | 80 | 80 | 320 | 4 | 63 |
| Ex. 5 | 70 | 30 | 95 | 5 | 700 | Air | 80 | 80 | 320 | 4 | 83 |
| Ex. 6 | 70 | 30 | 105 | 5 | 700 | Air | 80 | 80 | 320 | 4 | 65 |
| Ex. 7 | 70 | 30 | 100 | 5 | 700 | Air | 40 | 40 | 320 | 8 | 86 |
| Ex. 8 | 70 | 30 | 100 | 5 | 700 | Air | 80 | 120 | 320 | 3 | 74 |
| Ex. 9 | 70 | 30 | 100 | 5 | 700 | Air | 80 | 80 | 160 | 2 | 83 |
| Ex. 10 | 70 | 30 | 100 | 30 | 700 | Air | 80 | 80 | 320 | 4 | 62 |
| Ex. 11 | 70 | 30 | 100 | 5 | 500 | Air | 80 | 80 | 320 | 4 | 60 |
| Ex. 12 | 70 | 30 | 100 | 5 | 600 | Air | 80 | 80 | 320 | 4 | 64 |
| Ex. 13 | 70 | 30 | 100 | 5 | 800 | Air | 80 | 80 | 320 | 4 | 79 |
| Ex. 14 | 45 | 55 | 100 | 5 | 700 | Air | 80 | 80 | 320 | 4 | 62 |

TABLE 2

| | Dielectric thin film deposition conditions | | | | | | | | | |
|---|---|---|---|---|---|---|---|---|---|---|
| | Composition molar ratio | | | Baking conditions | | | Dielectric thin film thickness (nm) | | | Times process from coating to baking carried out | Evaluation Tunability (%) |
| | | | | Heating rate (° C./ min) | Baking temp. (° C.) | Atmo- sphere | Initial | 2nd time and beyond | Total thickness | | |
| | Ba | Sr | Ti | | | | | | | | |
| Ex. 15 | 45 | 55 | 100 | 5 | 700 | Atm. N$_2$ | 80 | 80 | 320 | 4 | 63 |
| Ex. 16 | 50 | 50 | 100 | 5 | 700 | Atm. N$_2$ | 80 | 80 | 320 | 4 | 65 |
| Ex. 17 | 70 | 30 | 100 | 5 | 700 | Atm. N$_2$ | 80 | 80 | 320 | 4 | 80 |
| Ex. 18 | 75 | 25 | 100 | 5 | 700 | Atm. N$_2$ | 80 | 80 | 320 | 4 | 60 |
| Ex. 19 | 70 | 30 | 95 | 5 | 700 | Atm. N$_2$ | 80 | 80 | 320 | 4 | 80 |
| Ex. 20 | 70 | 30 | 105 | 5 | 700 | Atm. N$_2$ | 80 | 80 | 320 | 4 | 68 |
| Ex. 21 | 70 | 30 | 100 | 5 | 700 | Atm. N$_2$ | 40 | 40 | 320 | 8 | 88 |
| Ex. 22 | 70 | 30 | 100 | 5 | 700 | Atm. N$_2$ | 80 | 120 | 320 | 3 | 72 |
| Ex. 23 | 70 | 30 | 100 | 5 | 700 | Atm. N$_2$ | 80 | 80 | 160 | 2 | 85 |
| Ex. 24 | 70 | 30 | 100 | 30 | 700 | Atm. N$_2$ | 80 | 80 | 320 | 4 | 63 |
| Ex. 25 | 70 | 30 | 100 | 5 | 500 | Atm. N$_2$ | 80 | 80 | 320 | 4 | 60 |
| Ex. 26 | 70 | 30 | 100 | 5 | 600 | Atm. N$_2$ | 80 | 80 | 320 | 4 | 68 |
| Ex. 27 | 70 | 30 | 100 | 5 | 800 | Atm. N$_2$ | 80 | 80 | 320 | 4 | 75 |
| Ex. 28 | 45 | 55 | 100 | 5 | 700 | Atm. N$_2$ | 80 | 80 | 320 | 4 | 66 |

TABLE 3

| | Composition molar ratio | | | Baking conditions | | | Dielectric thin film thickness (nm) | | | Times process from coating to baking carried out | Evaluation Tunability (%) |
| | | | | Heating rate (° C./min) | Baking temp. (° C.) | Atmo-sphere | Initial | 2nd time and beyond | Total thickness | | |
| --- | --- | --- | --- | --- | --- | --- | --- | --- | --- | --- | --- |
| | Ba | Sr | Ti | | | | | | | | |
| Comp. Ex. 1 | 10 | 90 | 100 | 5 | 700 | Air | 80 | 80 | 320 | 4 | 12 |
| Comp. Ex. 2 | 30 | 70 | 100 | 5 | 700 | Air | 80 | 80 | 320 | 4 | 30 |
| Comp. Ex. 3 | 90 | 10 | 100 | 5 | 700 | Air | 80 | 80 | 320 | 4 | 30 |
| Comp. Ex. 4 | 100 | 0 | 100 | 5 | 700 | Air | 80 | 80 | 320 | 4 | 29 |
| Comp. Ex. 5 | 70 | 30 | 100 | 5 | 700 | Air | 10 | 10 | 320 | 32 | — |
| Comp. Ex. 6 | 70 | 30 | 105 | 5 | 700 | Air | 160 | 160 | 320 | 2 | 51 |
| Comp. Ex. 7 | 70 | 30 | 100 | 5 | 700 | Air | 320 | — | 320 | 1 | 43 |
| Comp. Ex. 8 | 70 | 30 | 100 | 5 | 700 | Air | 80 | 80 | 800 | 10 | 50 |
| Comp. Ex. 9 | 70 | 30 | 100 | 5 | 700 | Air | 80 | — | 80 | 1 | — |
| Comp. Ex. 10 | 70 | 30 | 100 | 60 | 700 | Air | 80 | 80 | 320 | 4 | 43 |
| Comp. Ex. 11 | 70 | 30 | 100 | 100 | 700 | Air | 80 | 80 | 320 | 4 | 34 |
| Comp. Ex. 12 | 70 | 30 | 100 | 600 | 700 | Air | 80 | 80 | 320 | 4 | 28 |
| Comp. Ex. 13 | 70 | 30 | 100 | 5 | 450 | Air | 80 | 80 | 320 | 4 | 32 |
| Comp. Ex. 14 | 70 | 30 | 100 | 5 | 900 | Air | 80 | 80 | 320 | 4 | 83 |

TABLE 4

| | Composition molar ratio | | | Baking conditions | | | Dielectric thin film thickness (nm) | | | Times process from coating to baking carried out | Evaluation Tunability (%) |
| | | | | Heating rate (° C./min) | Baking temp. (° C.) | Atmo-sphere | Initial | 2nd time and beyond | Total thickness | | |
| --- | --- | --- | --- | --- | --- | --- | --- | --- | --- | --- | --- |
| | Ba | Sr | Ti | | | | | | | | |
| Comp. Ex. 15 | 10 | 90 | 100 | 5 | 700 | Atm. $N_2$ | 80 | 80 | 320 | 4 | 17 |
| Comp. Ex. 16 | 30 | 70 | 100 | 5 | 700 | Atm. $N_2$ | 80 | 80 | 320 | 4 | 35 |
| Comp. Ex. 17 | 90 | 10 | 100 | 5 | 700 | Atm. $N_2$ | 80 | 80 | 320 | 4 | 32 |
| Comp. Ex. 18 | 100 | 0 | 100 | 5 | 700 | Atm. $N_2$ | 80 | 80 | 320 | 4 | 31 |
| Comp. Ex. 19 | 70 | 30 | 100 | 5 | 700 | Atm. $N_2$ | 10 | 10 | 320 | 32 | — |
| Comp. Ex. 20 | 70 | 30 | 100 | 5 | 700 | Atm. $N_2$ | 160 | 160 | 320 | 2 | 45 |
| Comp. Ex. 21 | 70 | 30 | 100 | 5 | 700 | Atm. $N_2$ | 320 | — | 320 | 1 | 45 |
| Comp. Ex. 22 | 70 | 30 | 100 | 5 | 700 | Atm. $N_2$ | 80 | 80 | 800 | 10 | 52 |
| Comp. Ex. 23 | 70 | 30 | 100 | 5 | 700 | Atm. $N_2$ | 80 | — | 80 | 1 | — |
| Comp. Ex. 24 | 70 | 30 | 100 | 60 | 700 | Atm. $N_2$ | 80 | 80 | 320 | 4 | 39 |
| Comp. Ex. 25 | 70 | 30 | 100 | 100 | 700 | Atm. $N_2$ | 80 | 80 | 320 | 4 | 36 |
| Comp. Ex. 26 | 70 | 30 | 100 | 600 | 700 | Atm. $N_2$ | 80 | 80 | 320 | 4 | 25 |
| Comp. Ex. 27 | 70 | 30 | 100 | 5 | 450 | Atm. $N_2$ | 80 | 80 | 320 | 4 | 33 |
| Comp. Ex. 28 | 70 | 30 | 100 | 5 | 900 | Atm. $N_2$ | 80 | 80 | 320 | 4 | 80 |

As is clear from Tables 1 and 3, adequate tunability was unable to be obtained in Comparative Examples 1 to 4 in which the molar ratio of Ba, Sr and Ti deviates from the proper range.

In addition, in Comparative Example 5, in which the thickness of the thin film formed after the initial baking was less than 20 nm and the process from coating to baking was carried out in excess of 9 times, hillocks formed and adequate withstand voltage was unable to be obtained due to the presence of these hillocks. On the other hand, in Comparative Example 6, in which the thickness of the thin film formed after the initial baking exceeded 80 nm, and in Comparative Example 7, in which the dielectric thin film was formed in a single process from coating to baking, the desired columnar crystals were not obtained resulting in low tunability. In addition, in Comparative Example 8, in which the total thickness of the dielectric thin film exceeded 600 nm, high relative permittivity was unable to be obtained, and as a result thereof, adequate tunability was unable to be obtained. In Comparative Example 9, in which the total thickness was less than 100 nm and the dielectric thin film was formed with a single process from coating to baking, adequate withstand voltage was unable to be obtained.

In addition, in Comparative Examples 10 to 12, in which baking was carried out at a heating rate in excess of 50° C./min, the desired columnar crystals were not obtained and adequate tunability was unable to be obtained.

Moreover, in Comparative Example 13, in which baking was carried out a baking temperature below 500° C., adequate tunability was unable to be obtained as a result of not obtaining adequate crystallinity, while in Comparative Example 14, in which baking was carried out at a baking temperature above 800° C., although high tunability was obtained, this resulted in the occurrence of degeneration of the Pt lower electrode.

On the other hand, Examples 1 to 14, which satisfied all of the conditions, demonstrated superior results for all parameters.

In addition, as is clear from Tables 2 and 4, Examples 15 to 28, in which nitrogen gas at atmospheric pressure was used for the baking atmosphere, also demonstrated superior results for all parameters.

BRIEF DESCRIPTION OF THE REFERENCE SYMBOLS

11 Substrate
12 Insulator film
13 Adhesion layer
14 Lower electrode
16 Dielectric thin film
17 Upper electrode

The invention claimed is:

1. A process of forming a dielectric thin film comprising:
preparing a composition consisting of $Ba_{1-x}Sr_xTi_yO_3$ obtained by dissolving an organic barium compound, an organic strontium compound and a titanium alkoxide in an organic solvent at a molar ratio of Ba:Sr:Ti of 1-x:x:y;
coating and drying onto a support the composition to form a coated film; and baking the support on which the coated film has been formed for forming a $Ba_{1-x}Sr_xTi_yO_3$ thin film, wherein
the process from coating to baking is carried out two to nine times,
the thickness of the thin film formed after initial baking is 20 nm to 80 nm,
the thickness of each thin film formed after the second baking and beyond is 20 nm to less than 200 nm,
each baking from the first time to the second to ninth times is carried out by heating to a prescribed temperature within a range of 500° C. to 800° C. at a heating rate of 1° C. to 50° C./minute in an atmosphere at atmospheric pressure,
the total thickness of the dielectric thin film is 100 nm to 600 nm,
the values of x and y indicating the composition of the dielectric thin film are such that $0.2<x<0.6$ and $0.9<y<1.1$,
the organic barium compound and the organic strontium compound are metal salts of a carboxylic acid represented by the general formula $C_nH_{2n+1}COOH$ (where, $3 \le n \le 7$), and
the metal salts of the carboxylic acid have a structure shown in a following formula:

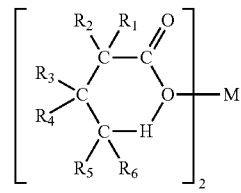

(wherein $R_1$ to $R_6$ represent hydrogen atoms, methyl groups or ethyl groups, and M represents Ba or Sr in the formula (2)), and
in a thin film capacitor having the dielectric thin film, the changing rate T of capacitance according to an applied voltage as indicated with the following formula (1) is 60% or more:

$$T=(C_{0V}-C_{5V})/C_{0V} \times 100 \qquad (1)$$

(wherein, $C_{0V}$ represents capacitance in the absence of an applied voltage, and $C_{5V}$ represents capacitance during an applied voltage of 5 V).

2. A thin film capacitor comprising:
a substrate;
an insulator film formed on the substrate;
an adhesion layer formed on the insulator film;
a lower electrode formed on the adhesion layer; a dielectric thin film formed by the formation process according to claim 1 on the lower electrode; and
an upper electrode formed on the dielectric thin film.

3. A tunable device comprising:
the thin film capacitor according to claim 2.

4. A dielectric thin film formed by the formation process according to claim 1 comprising:
a microstructure in which plurality of columnar crystals are longitudinally arranged in the direction of thickness in a longitudinal cross-section thereof.

* * * * *